(12) United States Patent
Park

(10) Patent No.: US 10,529,432 B2
(45) Date of Patent: Jan. 7, 2020

(54) DATA STORAGE DEVICE INCLUDING READ VOLTAGE SEARCH UNIT

(71) Applicant: Hyunkook Park, Anyang-si (KR)

(72) Inventor: Hyunkook Park, Anyang-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/415,011

(22) Filed: Jan. 25, 2017

(65) Prior Publication Data

US 2017/0235633 A1 Aug. 17, 2017

(30) Foreign Application Priority Data

Feb. 17, 2016 (KR) .................. 10-2016-0018626

(51) Int. Cl.
  *G11C 16/34* (2006.01)
  *G06F 3/06* (2006.01)
  *G06F 11/10* (2006.01)
  *G11C 13/00* (2006.01)
  *G11C 29/52* (2006.01)
  *G11C 16/04* (2006.01)

(52) U.S. Cl.
  CPC .......... *G11C 16/3404* (2013.01); *G06F 3/061* (2013.01); *G06F 3/064* (2013.01); *G06F 3/0619* (2013.01); *G06F 3/0679* (2013.01); *G06F 11/1048* (2013.01); *G06F 11/1072* (2013.01); *G11C 13/0033* (2013.01); *G11C 16/3427* (2013.01); *G11C 29/52* (2013.01); *G11C 16/0483* (2013.01)

(58) Field of Classification Search
  CPC .................. G11C 29/50004; G11C 16/3404
  See application file for complete search history.

(56) References Cited

U.S. PATENT DOCUMENTS

| | | | |
|---|---|---|---|
| 7,535,765 | B2 | 5/2009 | Maayan |
| 7,679,133 | B2 | 3/2010 | Son et al. |
| 8,072,805 | B2 | 12/2011 | Chou et al. |
| 8,122,329 | B2 | 2/2012 | Kong et al. |
| 8,179,718 | B2 | 5/2012 | Cho et al. |
| 8,516,183 | B2 | 8/2013 | Eun et al. |
| 8,553,466 | B2 | 10/2013 | Han et al. |
| 8,559,235 | B2 | 10/2013 | Yoon et al. |
| 8,639,141 | B2 | 1/2014 | Matsumoto |
| 8,654,587 | B2 | 2/2014 | Yoon et al. |
| 8,737,136 | B2 | 5/2014 | Cometti |

(Continued)

FOREIGN PATENT DOCUMENTS

| | | | |
|---|---|---|---|
| KR | 101005133 | B1 | 1/2011 |
| KR | 20140072637 | A | 6/2014 |
| KR | 20140091955 | A | 7/2014 |

*Primary Examiner* — Steve N Nguyen
(74) *Attorney, Agent, or Firm* — Harness, Dickey & Pierce, P.L.C.

(57) ABSTRACT

A data storage device according to example embodiments of inventive concepts includes a nonvolatile memory and a memory controller. In the nonvolatile memory, one read unit is configured to store a plurality of codewords. If a fail occurs in one or more codewords stored in the nonvolatile memory, the memory controller may search a read voltage of the nonvolatile memory using a correctable codeword. The data storage device according to example embodiments may predict an optimum read voltage level without performing a valley search operation.

17 Claims, 14 Drawing Sheets

(56) References Cited

U.S. PATENT DOCUMENTS

| | | | |
|---|---|---|---|
| 8,811,076 B2* | 8/2014 | Venkitachalam | G11C 16/0483 365/185.02 |
| 8,848,438 B2 | 9/2014 | Hu | |
| 9,117,536 B2 | 8/2015 | Yoon et al. | |
| 9,484,098 B1* | 11/2016 | Hsu | G11C 11/5642 |
| 9,715,429 B1* | 7/2017 | Lin | G06F 11/1068 |
| 2011/0233648 A1 | 9/2011 | Seol et al. | |
| 2012/0051143 A1* | 3/2012 | Yoon | G11C 16/0483 365/185.22 |
| 2012/0144267 A1* | 6/2012 | Yeh | G06F 11/1072 714/763 |
| 2013/0326296 A1* | 12/2013 | Choi | G11C 29/50004 714/721 |
| 2014/0101519 A1 | 4/2014 | Lee et al. | |
| 2014/0198569 A1 | 7/2014 | Kim et al. | |
| 2014/0355340 A1* | 12/2014 | Sharon | G11C 16/26 365/185.03 |
| 2015/0049548 A1 | 2/2015 | Park et al. | |
| 2015/0117125 A1 | 4/2015 | Choi et al. | |
| 2015/0124515 A1 | 5/2015 | Jung et al. | |
| 2015/0131376 A1* | 5/2015 | Tsang | G11C 16/26 365/185.03 |
| 2015/0205664 A1* | 7/2015 | Janik | G06F 11/1012 714/764 |
| 2015/0261467 A1 | 9/2015 | Seo et al. | |
| 2017/0102993 A1* | 4/2017 | Hu | G06F 11/1068 |

* cited by examiner

| Codeword | CW1 | CW2 | CW3 | CW4 | CW5 | CW6 | CW7 | CW8 |
|---|---|---|---|---|---|---|---|---|
| WL1 | 31 | 34 | 27 | 23 | 51 | 44 | 51 | 28 |
| WL2 | 25 | 35 | 32 | 23 | 34 | 35 | 22 | 21 |
| WL3 | 28 | 29 | 22 | 24 | 27 | 24 | 24 | 30 |
| WL4 | 19 | 18 | 38 | 16 | 35 | 31 | 24 | 20 |
| WL5 | 22 | 23 | 25 | 20 | 23 | 21 | 28 | 20 |
| WL6 | 27 | 21 | 18 | 43 | 22 | 18 | 36 | 16 |
| WL7 | 18 | 21 | 24 | 19 | 18 | 21 | 18 | 15 |
| WL8 | 20 | 15 | 14 | 20 | 15 | 21 | 18 | 19 |

|  | CW1 | CW2 | CW3 | CW4 | CW5 | CW6 | CW7 | CW8 |
|---|---|---|---|---|---|---|---|---|
| WL4 | Pass (19) | Pass (18) | Fail (38) | Pass (16) | Fail (35) | Pass (31) | Pass (24) | Pass (20) |

| PDT | ΔVrd1 | ΔVrd3 |
|---|---|---|
| 1 | +a | +b |
| 2 | +a | −b |
| 3 | −a | +b |
| 4 | −a | −b |

DATA STORAGE DEVICE INCLUDING READ VOLTAGE SEARCH UNIT

CROSS-REFERENCE TO RELATED APPLICATIONS

This U.S. non-provisional patent application claims priority under 35 U.S.C. § 119 to Korean Patent Application No. 10-2016-001826, filed on Feb. 17, 2016, the entire contents of which are hereby incorporated by reference.

BACKGROUND

Inventive concepts relate to semiconductor memory devices, and more particularly, to a data storage device including a read voltage search unit.

A semiconductor memory device is classified into a volatile memory device and a nonvolatile memory device. A volatile memory device has a high read/write speed but loses its stored data when its power is interrupted. A nonvolatile memory device retains its stored data even when its power is interrupted. Thus, a nonvolatile memory device is used to store data that should be preserved regardless of whether or not a power is supplied.

A typical example of a nonvolatile memory device includes a flash memory device. A flash memory device is widely being used as an audio and video data storage medium of information devices such as a computer, a cellular phone, a smart phone, a PDA, a digital camera, a camcorder, a voice recorder, a MP3 player, a handheld PC, a game machine, a fax machine, a scanner, a printer, etc. To load mobile devices such as a smart phone with a nonvolatile memory device, technologies of high capacity, high speed input/output, and low power consumption of a nonvolatile memory device are actively being studied As the demand for high capacity with respect to a nonvolatile memory device increases, a multi-level cell (MLC) or a multi-bit memory device configured to store multiple bits in a memory cell is becoming common. However, a threshold voltage of memory cells in a memory system that employs a multi-level cell (MLC) should be included in distinguishable four or more states within a limited voltage window. The states may move due to various causes. In this case, a read voltage may be adjusted to a read voltage optimized for the moved location of the states.

SUMMARY

Example embodiments of inventive concepts provide a data storage device. The data storage device may include a nonvolatile memory and a memory controller. In the nonvolatile memory, one read unit is configured to store a plurality of codewords. The memory controller is configured search a read voltage of the nonvolatile memory using a correctable codeword if a fail occurs in one or more of the codewords stored in the nonvolatile memory.

In example embodiments, the memory controller may search a read voltage of the nonvolatile memory based on fail bit information using the correctable codeword. The memory controller may be configured to search a moving direction of the read voltage of the nonvolatile memory. The memory controller may be configured to calculate a moving direction and a moving level of the read voltage of the nonvolatile memory. The memory controller may be configured calculate a moving level of the read voltage of the nonvolatile memory using the number of fail bits 1 and the number of fail bits 0.

Example embodiments of inventive concepts provide a data storage device. The data storage device may include a nonvolatile memory and a memory controller. In the nonvolatile memory, one read unit may be configured to store plurality of codewords. The memory controller may be configured to search a read voltage of the nonvolatile memory based on fail bit information calculated using a number of original memory cells stored in a specific state in a program operation, a number of memory cells of a specific state calculated by a read operation, and a correctable codeword if a fail occurs in one or more codewords stored in the nonvolatile memory.

In example embodiments, the memory controller may determine a moving direction of the read voltage by selecting a desired (and/or alternatively predetermined) set of the nonvolatile memory. The memory controller may include an ECC circuit and a read search unit. The ECC circuit may be configured to perform an error correction operation in units of codewords. The read voltage search unit may be configured to receive ECC information from the ECC circuit to perform a read voltage search operation. The read voltage search unit may search a read voltage level by calculating fail bit information of a whole codeword based on fail bit information of the correctable codeword. The read voltage search unit may predict a moving direction of the read voltage of the nonvolatile memory by comparing the number of fail bits 1 with the number of fail bits 0.

According to example embodiments of inventive concepts, a data storage device includes a nonvolatile memory and a memory controller connected to the nonvolatile memory. The nonvolatile memory includes a plurality of memory cells connected to a plurality of word lines and a plurality of bit lines. The plurality of memory cells are organized in read units configured to store a plurality of codewords. The memory controller includes a ECC circuit configured to perform an error correction on data read from the nonvolatile memory in units of the codewords. The memory controller includes a read voltage search unit that is configured to predict a moving direction of a read voltage for distinguishing program states in one of the read units of the nonvolatile memory if a fail occurs in one or more of the codewords stored in the nonvolatile memory.

BRIEF DESCRIPTION OF THE FIGURES

Example embodiments of inventive concepts will be described below in more detail with reference to the accompanying drawings. Example embodiments of inventive concepts may, however, be embodied in different forms and should not be constructed as limited to the embodiments set forth herein. Rather, these example embodiments are provided so that this disclosure will be thorough and complete, and will fully convey the scope of inventive concepts to those skilled in the art. Like numbers refer to like elements throughout.

DETAILED DESCRIPTION OF EXAMPLE EMBODIMENTS

Figure 1:
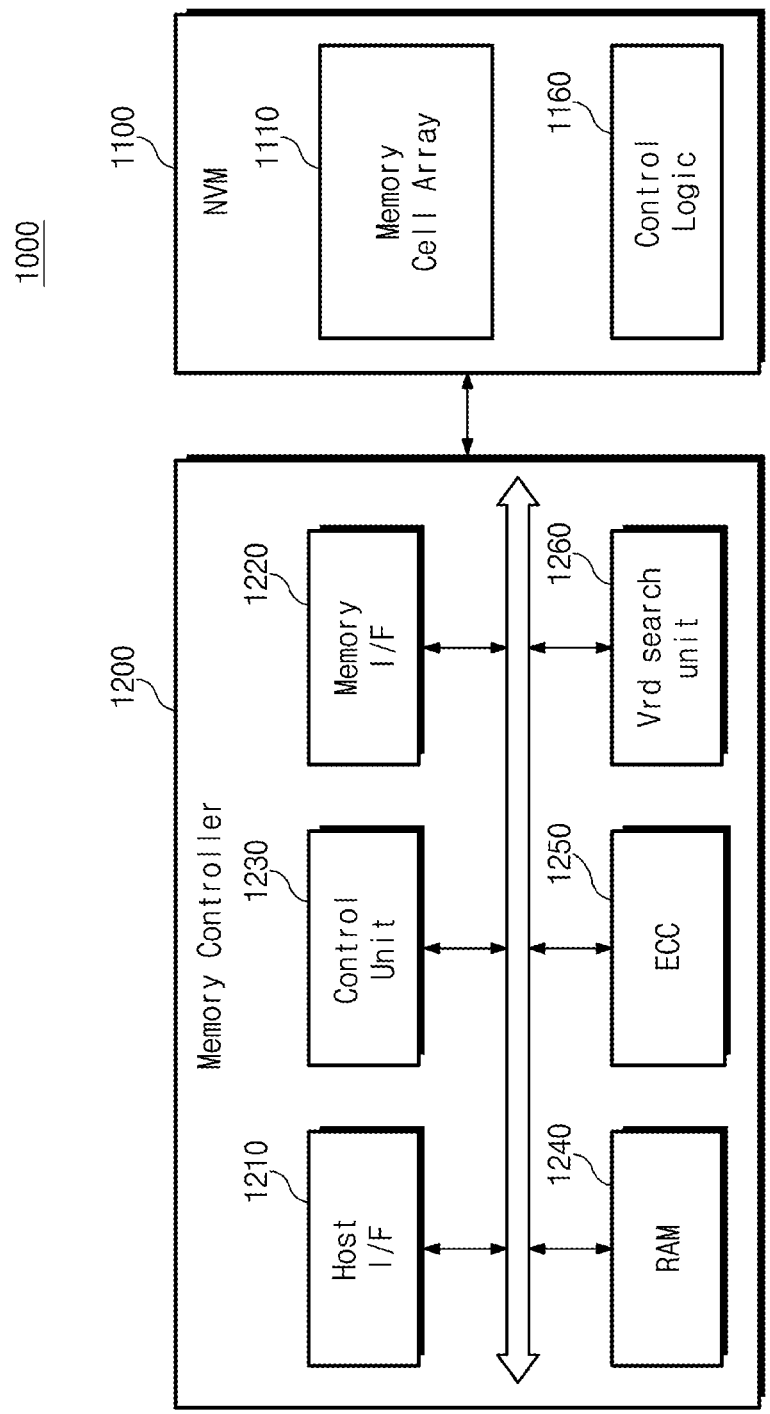
FIG. 1 is a block diagram illustrating a data storage device in accordance with example embodiments of inventive concepts.

Example embodiments of inventive concepts will be described more fully hereinafter with reference to the accompanying drawings, in which some example embodiments of inventive concepts are provided. Inventive concepts may, however, be embodied in many different forms and should not be construed as limited to the embodiments set forth herein. Rather, these example embodiments are provided so that this disclosure will be thorough and complete, and will fully convey the scope of inventive concepts to those skilled in the art. In the drawings, the size and relative sizes of layers and regions may be exaggerated for clarity. Like numbers refer to like elements throughout.

A NAND type flash memory device is used as an example of a nonvolatile memory device for describing features and functions of inventive concepts. However, those skilled in the art will readily appreciate other advantages and performance of inventive concepts by the described contents. For example, inventive concepts may be used in a PRAM, a MRAM, a ReRAM, a FRAM, a NOR flash memory, etc.

FIG. 1 is a block diagram illustrating a data storage device in accordance with example embodiments of inventive concepts. Referring to FIG. 1, a data storage device 1000 includes a nonvolatile memory 1100 and a memory controller 1200. The data storage device 1000 may include all the data storage mediums based on a nonvolatile memory such as a memory card, a USB memory, a SSD, etc.

Referring to FIG. 1, the nonvolatile memory 1100 includes a memory cell array 1110 and control logic 1160. The nonvolatile memory 1100 may be a flash memory, a PRAM, or a ReRAM depending on memory cells in the nonvolatile memory 1100. A distribution of memory cells in the nonvolatile memory 1100 may be changed due to repetition of a write, erase, or read operation or a change of a temperature condition. A read voltage level at which a bit error rate is reduced (and/or minimized) may be change due to a change of the distribution of the memory cells.

The memory cell array 1110 may have a two-dimensional structure (e.g., a horizontal structure) formed parallel to a substrate or a three-dimensional structure (e.g., a vertical structure) formed in a direction perpendicular to the substrate. The control logic 1160 can control a program, read or erase operation of the nonvolatile memory 1110.

Referring to FIG. 1, the memory controller 1200 controls a read, write or erase operation with respect to the nonvolatile memory 1100 in response to a request of a host. The memory controller 1200 includes a host interface 1210, a memory interface 1220, a control unit 1230, a RAM 1240, an ECC (error correction code) circuit 1250, and a read voltage search unit 1260.

The memory controller 1200 exchanges data with the host through the host interface 1210 and exchanges data with the nonvolatile memory 1100 through the memory interface 1220. The host interface 1210 may be connected to the host through a PATA (parallel AT attachment) bus, a SATA (serial AT attachment) bus, SCSI, USB, PCIe, etc.

The control unit 1230 can control an overall operation (e.g., read operation, write operation, file system management, read voltage management) with respect to the nonvolatile memory 1100. The control unit 1230 may include a central processing unit (CPU), a processor, a SRAM, a DMA controller, etc.

The RAM 1240 operates under the control of the control unit 1230 and may be used as a work memory, a buffer memory, a cache memory, etc. When the RAM 1240 is used as a work memory, data processed by the control unit 1230 is temporarily stored in the RAM 1240. When the RAM 1240 is used as a buffer memory, the RAM 1240 may be used to buffer data that will be transmitted from the host to the nonvolatile memory 1100 or from the nonvolatile memory 1100 to the host. When the RAM 1240 is used as a cache memory, the memory controller 1200 make the low speed nonvolatile memory 1100 operate at high speed.

The ECC circuit 1250 generates a fail bit of data received from the nonvolatile memory 1100 or an ECC (error correction code) for correcting the fail bit. The ECC circuit 1250 performs an error correction encoding of data being provided to the nonvolatile memory 1100 to form data including a parity bit. The parity bit may be stored in the nonvolatile memory 1100.

The ECC circuit 1250 may perform an error correction decoding with respect to data output from the nonvolatile memory 1100. The ECC circuit 1250 can correct an error using parity. The ECC circuit 1250 can correct an error using a coded modulation such as a LDPC (low density parity check) code, a BCH code, a turbo code, a Reed-Solomon code, a convolution code, a RSC (recursive systematic code), a TCM (trellis-coded modulation), a BCM (block coded modulation), etc.

The ECC circuit 1250 has an error correction allowable range. For example, the ECC circuit 1250 can correct up to 34 bit error with respect to 2 KB codewords. In this case, the maximum allowable range within which the ECC circuit 1250 can correct an error is 34 bits. That is, when an error of 34 or more bits occurs, the ECC circuit cannot correct an error of the codeword. A page including a codeword of which error is uncorrectable is called a defective page. In the defective page, a memory cell in which an error occurs is called a defective cell.

The read voltage search unit 1260 may perform a read voltage search operation and may be implemented in hardware or software. In a case where the read voltage search unit 1260 is implemented in software, its algorithms may be stored in the nonvolatile memory 1100 or the memory controller 1200, and may be driven through the RAM 1240 when a read voltage search operation is needed.

A distribution of memory cells in the nonvolatile memory 1100 may be changed due to repetition of a read or write operation or a change of a temperature condition. A read voltage level may be changed due to the change of distribution of memory cells. In a case where a distribution of memory cells is changed, the data storage device 1000 can search an optimum read voltage level using the read voltage search unit 1260. According to example embodiments of inventive concepts, a time taken to search the optimum read voltage level is reduced and thereby read performance of the data storage device 1000 is improved.

Figure 2:
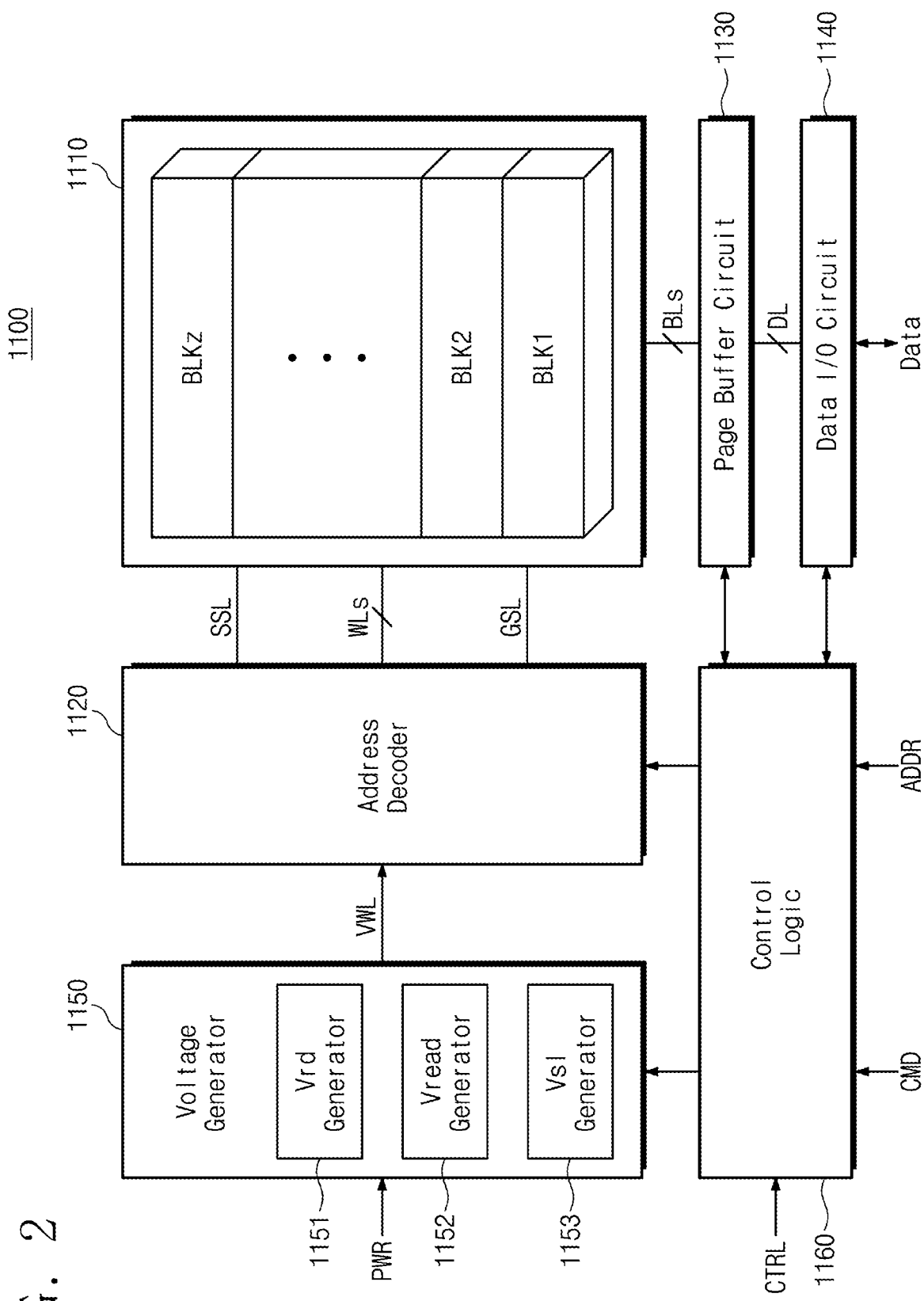
FIG. 2 is a block diagram illustrating a nonvolatile memory illustrated in FIG. 1.

FIG. 2 is a block diagram illustrating a nonvolatile memory illustrated in FIG. 1. A flash memory among various types of nonvolatile memories is illustrated in FIG. 2 as an illustration. The nonvolatile memory of inventive concepts may include a memory such as a PRAM and a ReRAM besides the flash memory.

Referring to FIG. 2, the nonvolatile memory 1100 includes a memory cell array 1110, an address decoder 1120, a page buffer circuit 1130, a data input/output circuit 1140, a voltage generator 1150, and control logic 1160.

The memory cell array 1110 includes a plurality of memory blocks BLK1~BLKz. Each memory block may have a two-dimensional structure or a three-dimensional structure. In a memory block having a two-dimensional structure (e.g., a horizontal structure), memory cells are formed in a direction parallel to a substrate. In a memory block having a three-dimensional structure, memory cells are formed in a direction perpendicular to the substrate.

In example embodiments of inventive concepts, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In example embodiments of inventive concepts, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, which word lines and/or bit lines shared between levels: U.S. Pat. Nos. 7,679,133; 8,553,466; 8,654,587; 8,559,235; and U.S. Pat. Pub. No. 2011/0233648.

Further referring to FIG. 2, the address decoder 1120 is connected to the memory cell array 1110 through select lines (SSL, GSL) or word lines WLs. The address decoder 1120 receives a word line voltage VWL from the voltage generator 1150 and is controlled by the control logic 1160. The address decoder 1120 selects a word line in a program or read operation. A select read voltage or a read voltage is provided to the selected word line.

The page buffer circuit 1130 is connected to the memory cell array 110 through bit lines BLs. The page buffer circuit 1130 may include a plurality of page buffers (not illustrated). One bit line is connected to one page buffer but two or more bit lines may be connected to one page buffer. The page buffer circuit 1130 may temporarily store data to be programmed in a selected page or data read from the selected page.

The data input/output circuit 1140 is internally connected to the page buffer circuit 1130 through a data line DL and is externally connected to the memory controller 1200 (refer to FIG. 1) through an input/output line (I/O). The input/output circuit 1140 receives program data from the memory controller 1200 in a program operation and provides read data to the memory controller 1200 in a read operation.

The voltage generator 1150 receives electric power (PWR) from the memory controller 1200 to generate and may generate a word line voltage VWL used to read or write data. The word line voltage VWL is provided to the address decoder 1120. The voltage generator 1150 can generate a high voltage HV higher than a power supply voltage Vcc. The high voltage may be used as a program voltage Vpgm in a program operation, may be used as a read voltage Vread in a read operation, and may be used as an erase voltage Verase in an erase operation. The voltage generator 1150 includes a select read voltage (Vrd) generation circuit 1151, an unselected read voltage (Vread) generation circuit 1152, and a selection line voltage (Vsl) circuit 1153.

The control logic 1160 can control program, read, erase operations of the nonvolatile memory 1100 using a command CMD, an address ADDR, and a control signal CTRL being provided from the memory controller 1200. For example, in a read operation, the control logic 1160 can control the address decoder 1120 such that the Vrd generation circuit 1151 provides a select read voltage Vrd to a select word line, the Vread generation circuit provide an unselect read voltage Vread to an unselected word line, the Vsl circuit applies a selection line voltage Vsl to selection line, and can read data from a select page by controlling the page buffer circuit 1130 and the data input/output circuit 1140.

Figure 3:
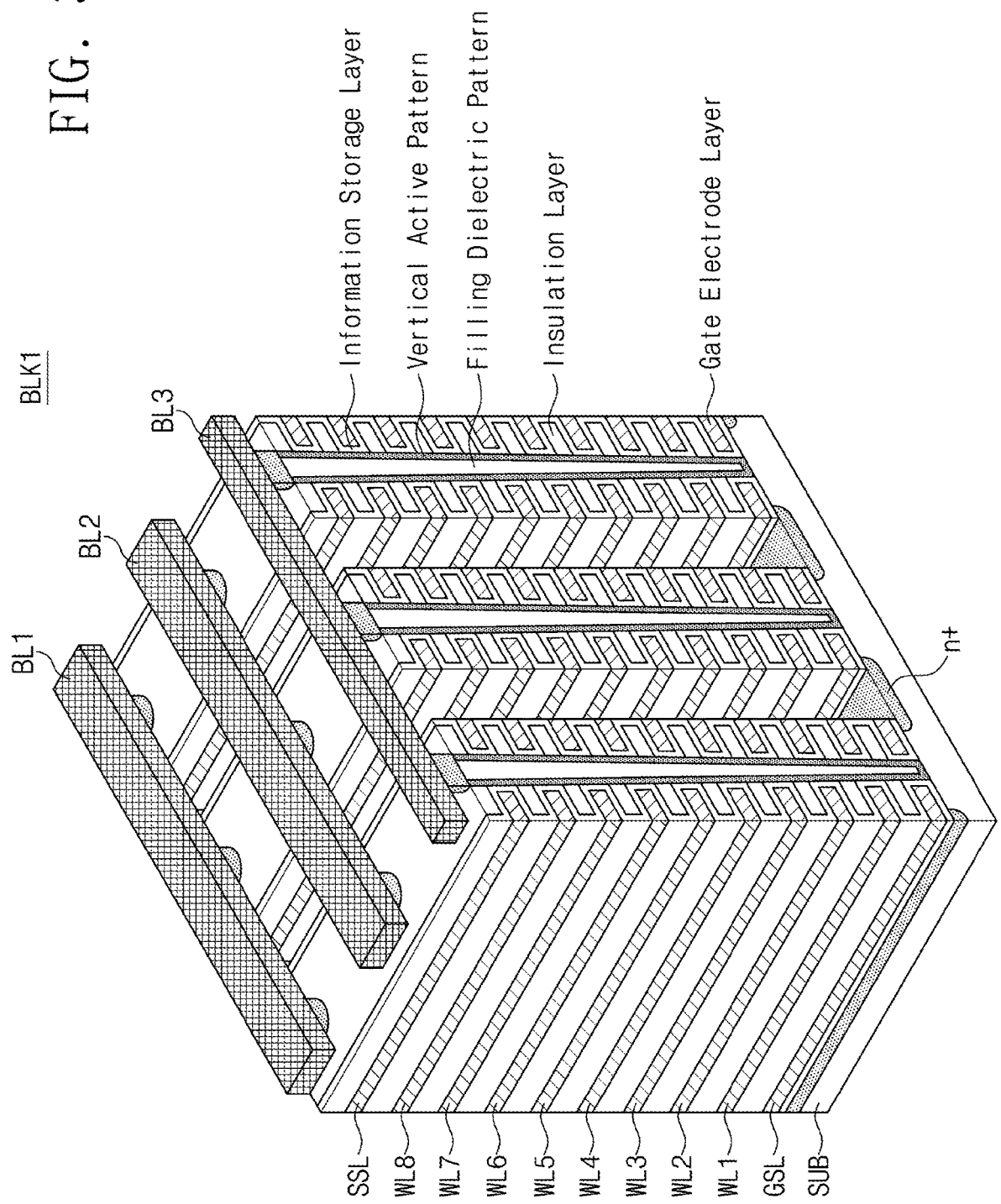
FIG. 3 is a perspective view illustrating a three-dimensional structure of a memory block BLK1 illustrated in FIG. 2.

FIG. 3 is a perspective view illustrating a three-dimensional structure of a memory block BLK1 illustrated in FIG. 2. Referring to FIG. 3, the memory block BLKi is formed in a direction perpendicular to a substrate SUB. An n+ doping region is formed in the substrate SUB.

A plurality of gate electrode layers and insulating layers may be alternately deposited on the substrate SUB. An information storage layer may be formed between the gate electrode layers and the insulating layers.

A pillar of a V character shape may be formed by pattering the gate electrode layers and the insulating layers in a vertical direction. The pillar may penetrate the gate electrode layers and the insulating layers to connect to the substrate SUB. The inside of the pillar has a filling dielectric pattern and may be configured as an insulating material such as silicon oxide. The outside of the pillar has a vertical active pattern and may be configured as a channel semiconductor.

The gate electrode layers of the memory block BLK1 may be connected to a ground select line GSL, a plurality of word lines WL1~WL8, and a string select line SSL. The pillar of the memory block BLK1 may be connected to a plurality of bit lines BL1~BL3. In FIG. 3, the memory block BLK1 is illustrated to have two select lines GSL and SSL, eight word lines WL1~WL8, and three bit lines BL1~BL3 but in reality, the number of select lines, word lines, and bit lines is not limited thereto.

Figure 4:
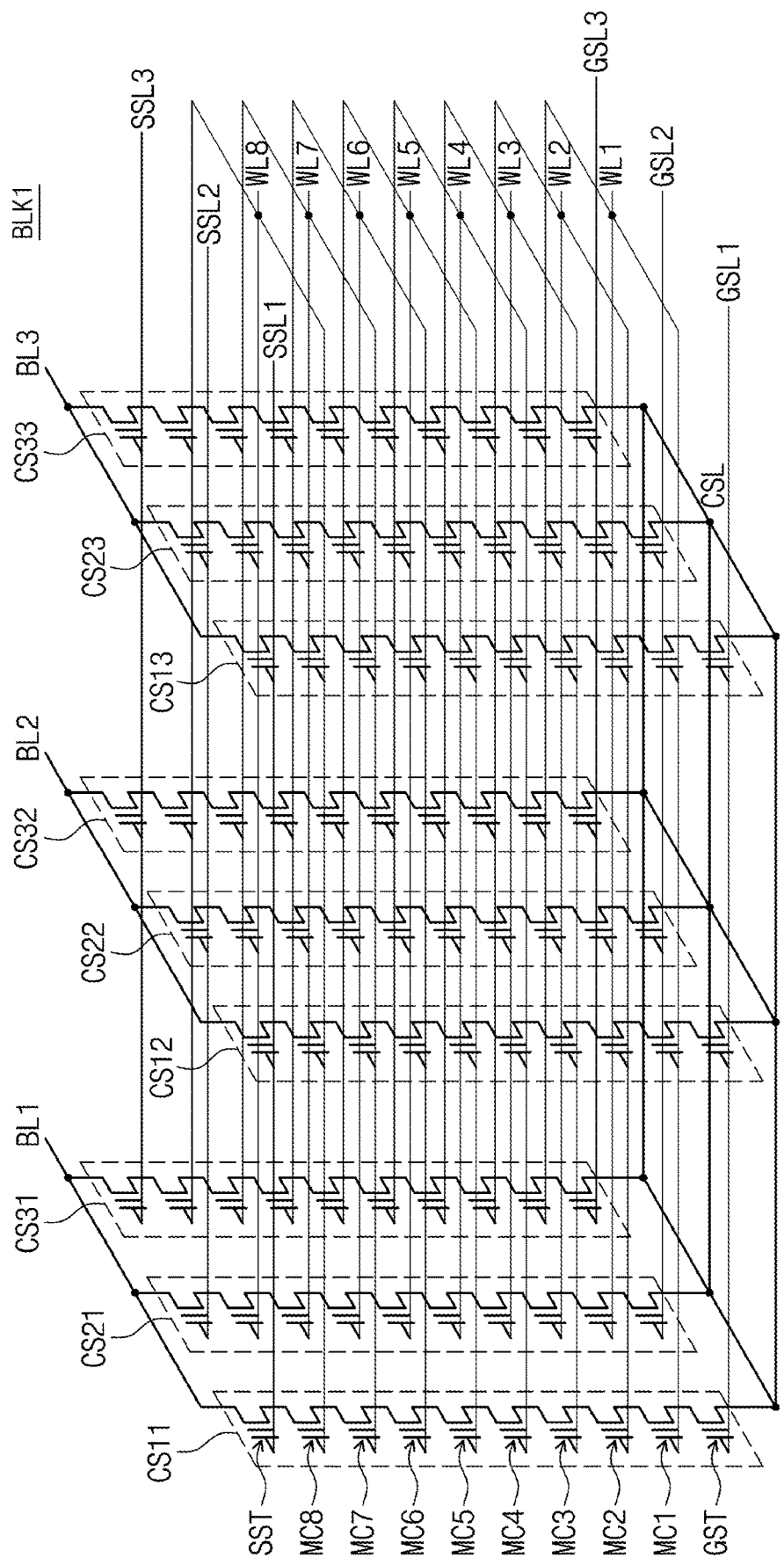
FIG. 4 is an equivalent circuit of a memory block BLK1 illustrated in FIG. 3.

FIG. 4 is an equivalent circuit of a memory block BLK1 illustrated in FIG. 3. Referring to FIG. 4, cell strings CS11~CS33 are connected between bit lines BL1~BL3 and a common source line CSL. Each cell string (e.g., CS11) includes a ground select transistor GST, a plurality of memory cells MC1~MC8, and a string select transistor SST.

The string select transistor SST is connected to a string selection line SSL. The string select line SSL is divided into first through third string select lines SSL1~SSL3. The ground select transistor GST is connected to a ground select line GSL. In FIG. 4, the ground select line GSL is divided into GSL1, GSL2 and GSL3, but the ground select line GSL may also be connected to one another. The string select transistor SST is connected to the bit line BL and the ground select transistor GST is connected to the common source line CSL.

The plurality of memory cells MC1~MC8 is connected to corresponding word lines WL1~WL8 respectively. A set of memory cells connected to one word line and programmed at the same time is called a page. The memory block BLK1 includes a plurality of pages. A plurality of pages may be connected to one word line. Referring to FIG. 4, a word line (e.g., WL4) located at the same height from the common source line CSL is connected to three pages in common.

Each memory cell can store 1-bit data or data of 2 or more bits. A memory cell capable of storing 1-bit data in one memory cell is called a single level cell (SLC) or a single bit cell. A memory cell capable of storing multi-bit (e.g., two or more bits) data is called a multi-level cell (MLC) or a multi-bit cell. In a case of 2-bit MLC, two page data is stored in one physical page. Thus, six page data may be stored in a memory cell connected to the fourth word line WL4.

Figure 5A:
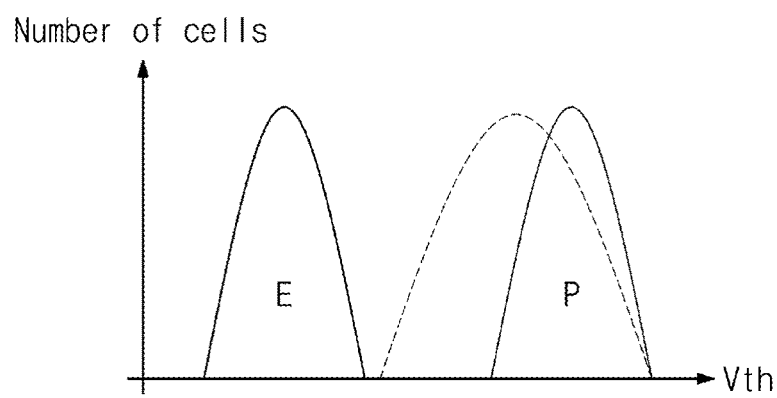
FIGS. 5(a) to 5(c) are diagrams illustrating a threshold voltage distribution of when a memory cell illustrated in FIG. 4 is a single level cell (SLC).
Figure 5B:
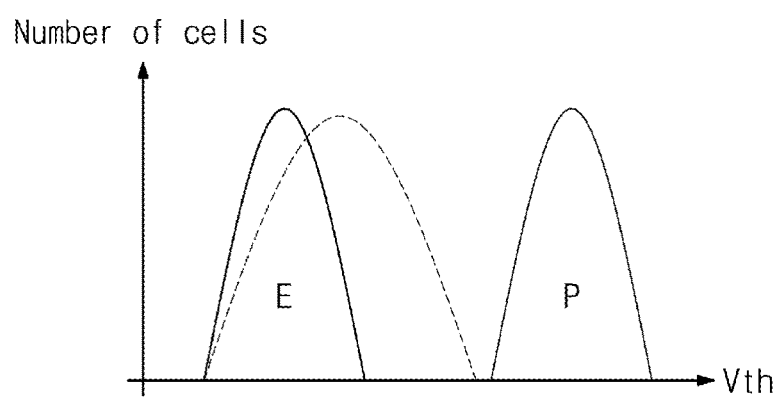
Figure 5C:
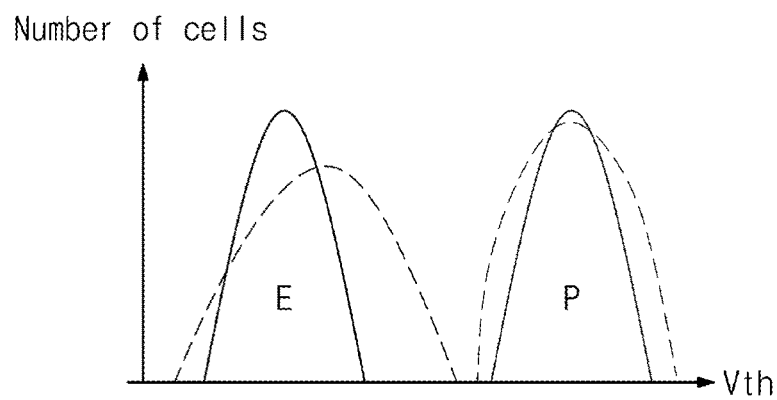

FIGS. 5(a) to 5(c) are diagrams illustrating a threshold voltage distribution of when a memory cell illustrated in FIG. 4 is a single level cell (SLC). In FIGS. 5(a), 5(b), and 5(c), a horizontal axis represents a threshold voltage Vth of a memory cell and a vertical axis represents the number of memory cells. The single level cell (SLC) has an erase state E or a program state P depending on a threshold voltage.

A defect of a memory cell may occur during not only its manufacturing process but also the use of products. A defect that occurs during a manufacturing process is called an initial defect and a defect that occurs during the use of products is called a progressive defect. A distribution of threshold voltages of memory cells may be changed due to a progressive defect.

In FIGS. 5(a), 5(b) and 5(c), a solid line represents an initial state of a distribution of threshold voltages and a dotted line represents a change of a distribution of threshold voltages due to a progressive defect. In an initial state, an erase state E and a program state P secure a sufficient read margin. However, when a progressive defect occurs, neighboring program states may not secure a sufficient read margin.

For example, when an operating temperature increases in a flash memory, loss of trapped charges occurs and thereby a distribution change may occur in a direction in which a threshold voltage of the program state is reduced (refer to FIG. 5 (a)).

When the number of read operations increases in a flash memory, a charge trap occurs in a cell of an erase state due to read disturb and thereby an erase distribution may be changed in a direction in which a threshold voltage increases (refer to FIG. 5 (b)). In a flash memory, deterioration may occur in a tunnel oxide due to an increase of the number of write operations. In this case, a distribution change may occur in a direction in which a threshold voltage of the erase state increases (refer to FIG. 5 (b)).

FIG. 5 (c) illustrates an example where a progressive defect occurs in a memory cell having a program state P and an erase state E. Such progressive defect may occur when data is repeatedly written and erased, when data is repeatedly read, or when a large amount of time passes after data is written.

Figure 6A:
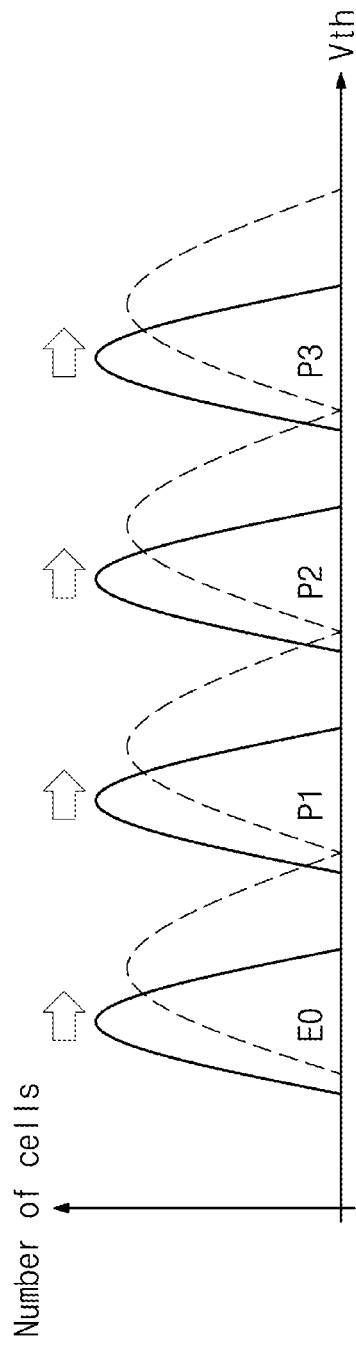
FIGS. 6(a) to 6(c) are diagrams illustrating a threshold voltage distribution of when a memory cell illustrated in FIG. 4 is a multi level cell (MLC).
Figure 6B:
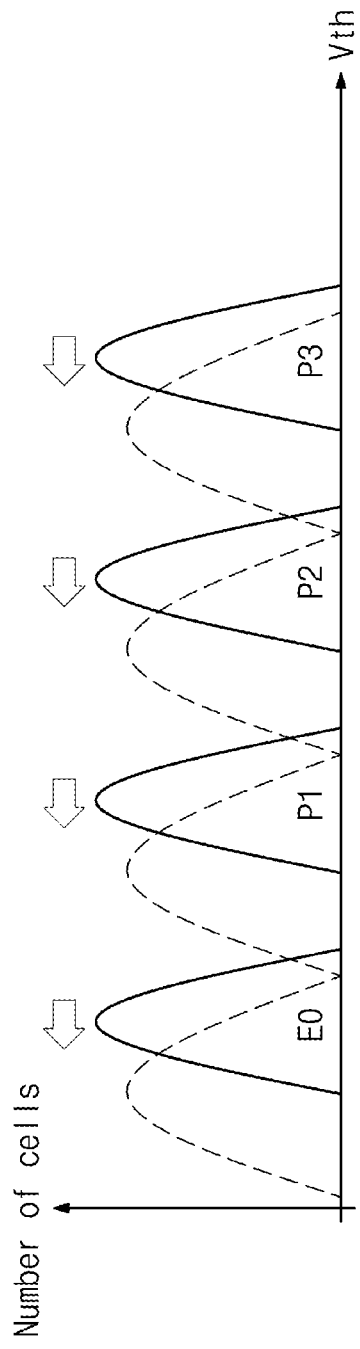
Figure 6C:
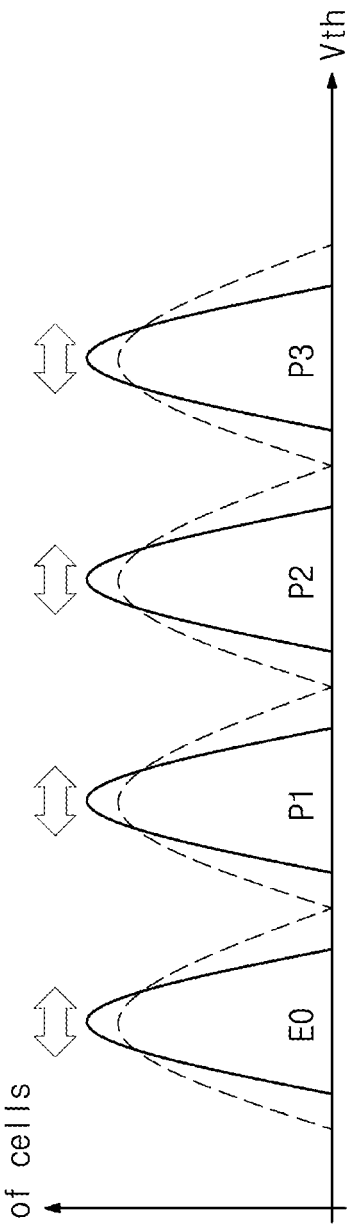

FIGS. 6(a) to 6(c) are diagrams illustrating a threshold voltage distribution of when a memory cell illustrated in FIG. 4 is a multi level cell (MLC). The multi level cell (MLC) may include four states (E0, P1, P2, P3) depending on a threshold voltage.

In FIGS. 6(a), 6(b), and 6(c), a solid line represents a distribution of threshold voltages of an initial state and a dotted line represents a distribution of threshold voltages of when a progressive defect occurs. In the initial state, neighboring states secure a sufficient read margin. However, if a progressive defect occurs, the neighboring states may not secure a sufficient read margin to overlap each other.

FIG. 6 (a) illustrates an example where a progressive defect occurs in a direction in which threshold voltages of memory cells increase. FIG. 6 (b) illustrates an example where a progressive defect occurs in a direction in which threshold voltages of memory cells decreases. FIG. 6 (c) illustrates an example where a progressive defect occurs in a direction in which a distribution of threshold voltages of memory cells widens in both directions. Such progressive defect may occur when data is repeatedly written and erased, when data is repeatedly read, or when a large amount of time passes after data is written.

Distribution deterioration may occur in a PRAM and a ReRAM which are resistive memories due to deterioration of GST and transformation of a transition layer by repetition of a write operation. Distribution deterioration may occur in a resistive memory due to an external factor such as a temperature. The data storage device 1000 according to example embodiments of inventive concepts, in a case where a distribution of memory cells is changed, provides a method of searching an optimum read voltage level. According to example embodiments of inventive concepts, a time taken to search the optimum read voltage level is reduced and thereby read performance of the data storage device 1000 is improved.

Figure 7:
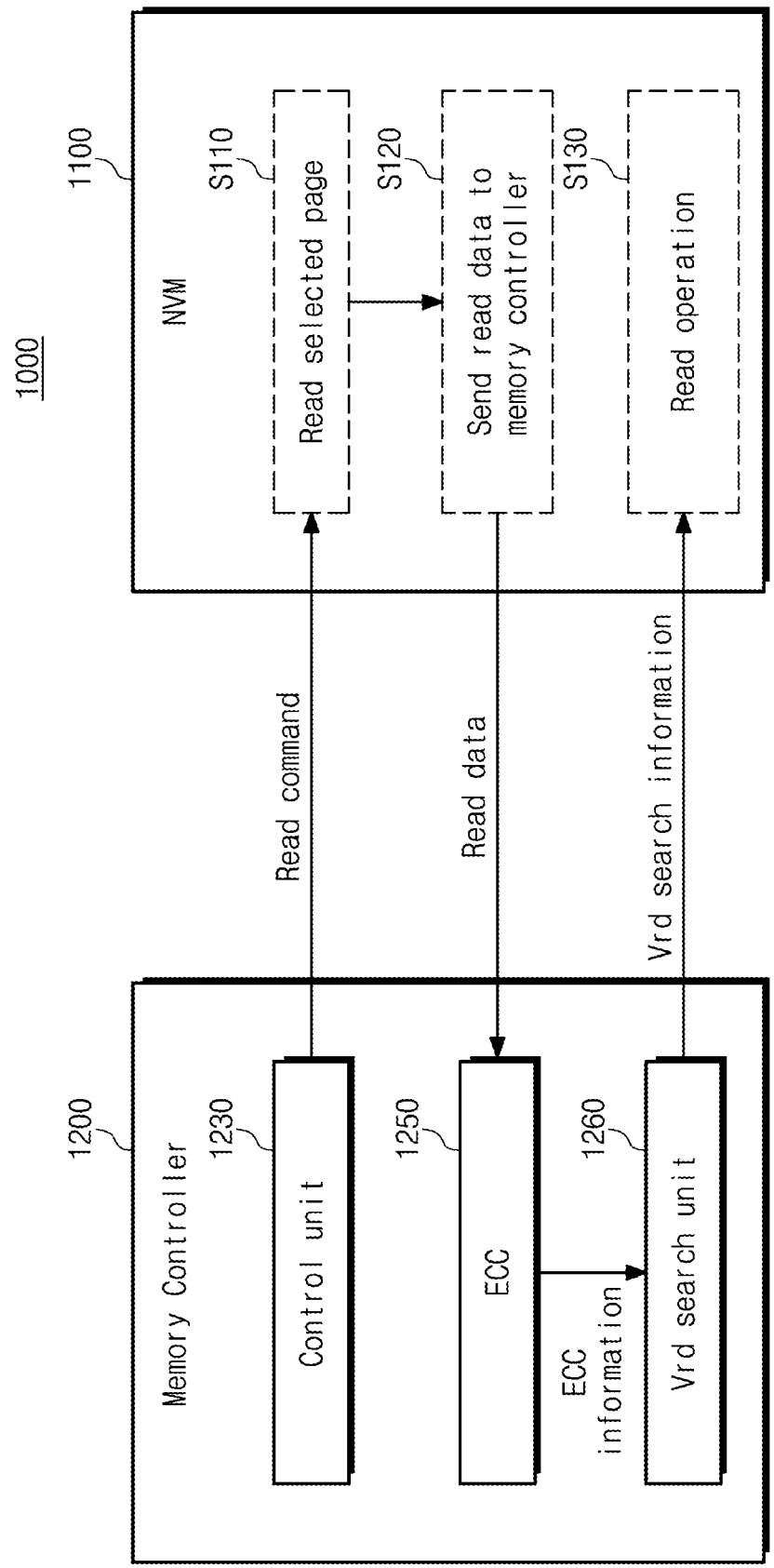
FIG. 7 is a block diagram illustrating a process in which a data storage device illustrated in FIG. 1 performs a read voltage search operation.

FIG. 7 is a block diagram illustrating a process in which a data storage device illustrated in FIG. 1 performs a read voltage search operation. Referring to FIG. 7, a data storage device 1000 includes a nonvolatile memory 1100 and a memory controller 1200. The memory controller 1200 includes a control unit 1230, an ECC circuit 1250, and a read voltage search unit 1260.

The control unit 1230 provides a read command to the nonvolatile memory 1100. The memory controller 1200 provides an address ADDR together with the read command. The address ADDR is to select a page in which data is to be read.

The nonvolatile memory 1100 performs a read operation in response to the read command. The order of a read operation performed inside the nonvolatile memory 1100 is briefly illustrated in FIG. 7.

A read operation is performed with respect to a selected page (S110). A select read voltage Vrd is provided to a selected word line and an unselect read voltage Vread is provided to an unselected word line. The nonvolatile memory 1100 provides read data to the memory controller 1200 (S120).

The ECC circuit 1250 performs an error correction operation with respect to read data provided from the memory controller 1200. The ECC circuit 1250 performs an error correction operation in units of codewords. The ECC circuit 1250 has the maximum number of error correction bits. For example, the ECC circuit 1250 can correct up to a threshold value (e.g., 34 bit error) with respect to one codeword. When an error at or above the threshold value (e.g., 35 or more bits) occurs, the ECC circuit 1250 cannot correct an error of the page. The ECC circuit 1250 provides ECC information to the read voltage search unit 1260.

The read voltage search unit 1260 performs a read voltage search operation based on the ECC information received from the ECC circuit 1250. The read voltage search unit 1260 provides read voltage search information to the nonvolatile memory 1100. The nonvolatile memory 1100 receives the read voltage search information to perform a read operation (S130).

Figures 8, 9, 10:
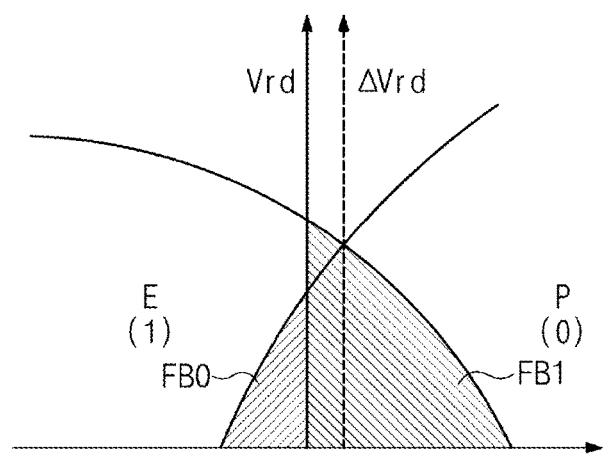
FIG. 8 is a table for explaining an operation of a read voltage search unit of FIG. 7.
FIG. 9 is a conceptual diagram illustrating an ECC operation result of a fourth word line illustrated in FIG. 8.
FIG. 10 is a diagram for explaining a moving direction of a read voltage and a moving level of the read voltage.

FIG. 8 is a table for explaining an operation of a read voltage search unit of FIG. 7. It is assumed that the nonvolatile memory 1100 of FIG. 7 is a flash memory and the flash memory includes eight word lines WL1~WL8. As illustrated in FIG. 8, each word line (or a page) includes eight codewords. It is also assumed the ECC circuit 1250 can correct up to 34 bit error with respect to one codeword.

Referring to FIG. 8, the table illustrates the number of fail bits with respect to each codeword CW. For example, third and fifth codewords (CW3, CW5) of the fourth word line WL4 have an uncorrectable error. That is, the third and fifth codewords (CW3, CW5) of the fourth word line WL4 have the fail bit number of 35 or more bits. The third codeword CW3 has the fail bit number of 38 bits and the fifth codeword CW5 has the fail bit number of 35 bits.

Fourth and seventh codewords (CW4, CW7) of the sixth word line WL6 have an uncorrectable error. An error of 43 bits occurs in the fourth codeword CW4 and an error of 36 bits occurs in the seventh codeword CW7. In the table of FIG. 8, the flash memory has an uncorrectable error in the four word lines (WL1, WL2, WL4, and WL6).

Due to several causes such as cell variation and power noise, the flash memory may have a different number of fail bits from each other according to a word line or a codeword. In the flash memory, although an uncorrectable error occurs in a word line, an error does not occur in all the codewords of the word line. An uncorrectable error may partly occur.

FIG. 9 is a conceptual diagram illustrating an ECC operation result of a fourth word line illustrated in FIG. 8. Referring to FIG. 9, a page of the fourth word line WL4 includes 8 codewords CW1~CW8. For example, if one page is 16 KB, one codeword may be 2 KB. If an ECC operation is performed, the third and fifth codewords (CW3, CW5) are processed as 'fail' due to an uncorrectable error. If an ECC operation is performed, the remaining codewords (CW1, CW2, CW4, CW6, CW7, and CW8) are processed as 'pass' due to an correctable error.

A fail bit of correctable codeword can be corrected through an ECC operation and the number of 0 and 1 fail bits may be known in the process of correction. For example, if the number of fail bits of the first codeword CW1 is 19, the number of 1 fail bits that corrects 1 fail bit to 0 fail bit and the number of 0 fail bits that corrects 0 fail bit to 1 fail bit may be known. The number of fail bits of a pass codeword that occurred in a page of the fourth word line WL4 may be calculated using mathematical formula 1.

$$FB1'=\Sigma FB \text{ of pass CW (pass CW=1,2,4,6,7,8)}$$
$$FB0'=\Sigma FB \text{ of pass CW (pass CW=1,2,4,6,7,8)}$$
[mathematical formula 1]

Here, the FB1' means the number of 1 fail bits of the pass codeword and the FB0' means the number of 0 fail bits of the pass codeword. The FB1' and the FB0' are the number of fail bits actually calculated.

The number of fail bits of all codewords that occurred in the page of the fourth word line WL4 may be predicted using mathematical formula 2.

$$FB0:(FB1+FB0)=FB0':(FB1'+FB0') \quad \text{[mathematical formula 2]}$$

Here, the FB1 means the number of 1 fail bits of all the codewords and the FB0 means the number of 0 fail bits of all the codewords. The FB1 and the FB0 are the number of fail bits which is predicted. The FB1+FB0 is the total number of fail bits that occurred in the page of the fourth word line WL4. The total number (FBa) of the fail bits can be calculated with reference to FIG. 8. For example, the total number of fail bits that occurred in the page of the fourth word line WL4 is 19+18+38+ . . . +20=201. The mathematical formula 2 may expressed by mathematical formula 3 below.

$$FB1=FB1'\times[(FB1+FB0)/(FB1'+FB0')]=FB1'\times FBa/(FB1'+FB0')$$

$$FB0=FB0'\times[(FB1+FB0)/(FB1'+FB0')]=FB0'\times FBa/(FB1'+FB0') \quad \text{[mathematical formula 3]}$$

An optimum read voltage level may be predicted using the mathematical formula 3. That is, a moving direction and a moving level of the read voltage may be predicted. The moving direction of the read voltage may be predicted by comparing the size of the FB1 with the size of the FB0. The moving level of the read voltage may be predicted through a function of FB1 and FB0 as illustrated in a mathematical formula 4.

$$\Delta Vrd = f(FB0, FB1) \quad \text{[mathematical formula 4]}$$

FIG. 10 is a diagram for explaining a moving direction of a read voltage and a moving level of the read voltage. Referring to FIG. 10, a memory cell has an erase state E and a program state P depending on a threshold voltage Vth. Assume that a read voltage being provided to a select word line in an initial state is Vrd. As described above, an erase state E and a program state P of a memory cell may overlap each other due to cell deterioration. In this case, if performing a read operation using the Vrd, the fail bit number of FB0 and the fail bit number of FB1 may occur.

In FIG. 10, the read voltage may move in a direction where the total number of fail bits is reduced. An optimum moving level ($\Delta$Vrd) of the read voltage may be predicted using the function of FB0 and FB1. The data storage device 1000 may predict an optimum read voltage level.

Figure 11:
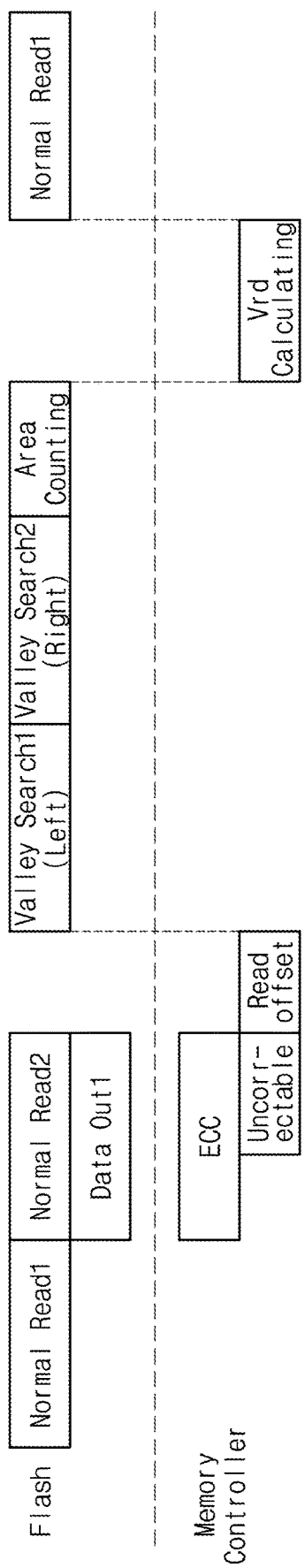
FIGS. 11 and 12 are timing diagrams illustrating read performance of a data storage device illustrated in FIG. 1.
Figure 12:
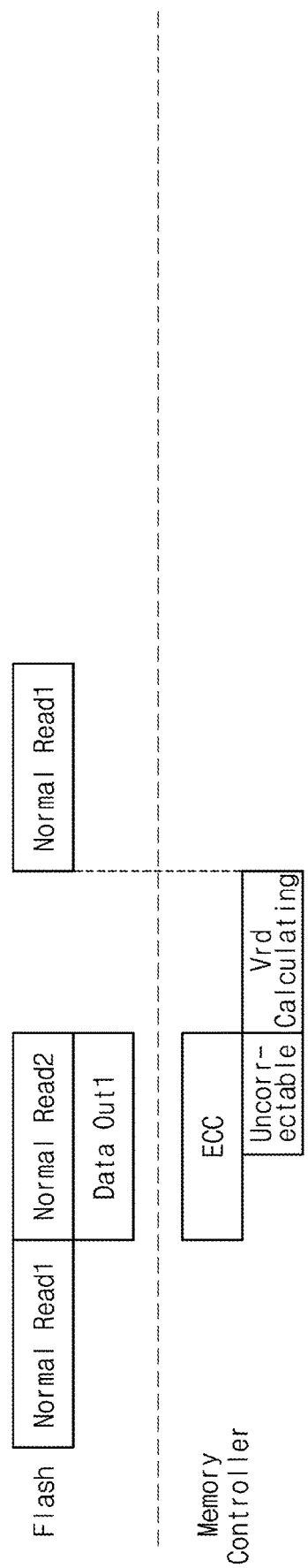

FIGS. 11 and 12 are timing diagrams illustrating read performance of a data storage device illustrated in FIG. 1. FIG. 11 illustrates a read operation process according to a conventional art and FIG. 12 illustrates a read operation process according to example embodiments of inventive concepts.

Referring to FIGS. 11 and 12, first and second normal read operations are sequentially performed on the flash memory 1100 (refer to FIG. 7, S110). The flash memory 1100 performs a data output operation (Data out 1) according to the first read operation (refer to FIG. 7, S120). The memory controller 1200 performs an ECC operation.

Referring to FIG. 11, a data storage device according to a conventional art, if uncorrectable errors occur, performs two valley search operations after performing a read offset. The valley search operation is an operation for searching an optimum read voltage level. The first valley search is performed on the left and the second valley search is performed on the right based on the read voltage level of a threshold voltage distribution of FIG. 10.

A read operation according to a conventional art performs read operations at least two times additionally besides the first normal read operation. The number of memory cells of two areas generated as a consequence of the read operation is counted. According to the conventional art, a read voltage is predicted and the first normal read operation is performed after an operation of counting the number of memory cells and at least three read operations are performed.

Referring to FIG. 12, the data storage device 1000 according to example embodiments of inventive concepts, if uncorrectable errors occur, performs a read voltage search operation. The read voltage search unit 1260 (refer to FIG. 7) receives ECC information from the ECC circuit 1250 (refer to FIG. 7) and calculates a moving direction and a moving level of the read voltage according to the method described in FIGS. 8 through 10. The data storage device 1000 finally performs the first normal read operation based on the read voltage search information.

The data storage device 1000 may reduce two valley search operations and an area counting operation. According to example embodiments of inventive concepts, performance of the read operation may be improved by predicting an optimum read voltage level without a valley search operation.

Figures 13, 14:
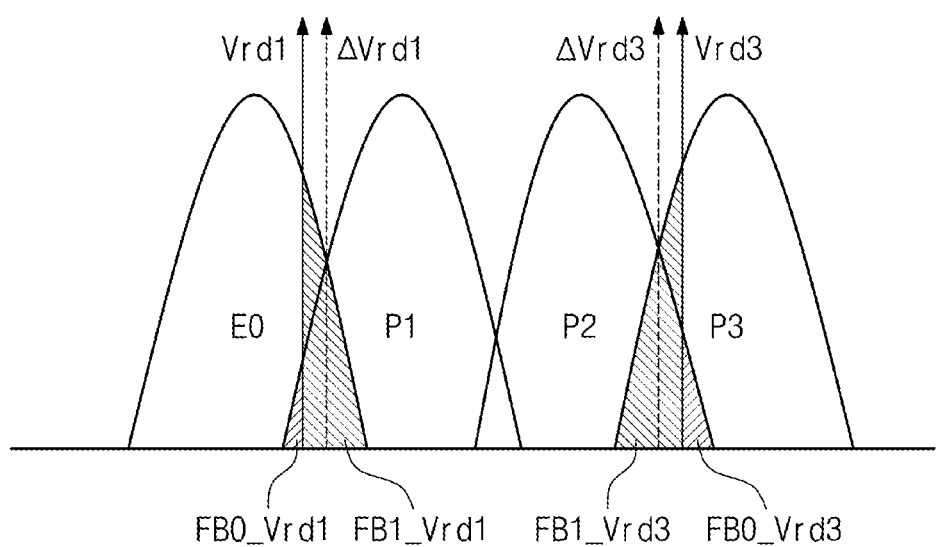
FIG. 13 is a diagram for explaining a method of predicting a moving direction of a read voltage and a moving level of the read voltage of when a nonvolatile memory illustrated in FIG. 1 is a multi-level cell.
FIG. 14 is a table for explaining a method of predicting a moving direction of a read voltage.

FIG. 13 is a diagram for explaining a method of predicting a moving direction of a read voltage and a moving level of the read voltage of when a nonvolatile memory illustrated in FIG. 1 is a multi-level cell. Referring to FIG. 13, a memory cell may include an erase state E0 and three program states (P1, P2, P3) depending on a threshold voltage Vth.

Assume that read voltages being provided to a select word line in an initial state are Vrd1, Vrd2 and Vrd3. Here, the Vrd1 is a read voltage level to distinguish between the E0 and the P1. Although not illustrated, the Vrd2 is a read voltage level to distinguish between the P1 and the P2. The Vrd3 is a read voltage level to distinguish between the P2 and the P3. Neighboring states of memory cells may overlap each other due to cell deterioration. In this case, if performing a read operation using the Vrd, the fail bit number of FB0 and the failed bit number of FB1 may occur.

In FIG. 13, FB0_Vrd1 is the number of 0 fail bits that occurred based on the Vrd1 and FB1_Vrd1 is the number of 1 fail bits that occurred based on the Vrd1. FB0_Vrd3 is the number of 0 fail bits that occurred based on the Vrd3 and FB1_Vrd3 is the number of 1 fail bits that occurred based on the Vrd3.

In a program operation, the data storage device 1000 according to example embodiments of inventive concepts stores the number of cells of each state (E0, P1, P2, and P3). The data storage device 1000 may predict a moving direction and a moving level of the read voltage using the number of cells and ECC information. Assume that the number of original memory cells of each state stored in a program operation is NE0, NP1, NP2 and NP3 respectively. Assume that the number of memory cells of the erase state E0 read based on the Vrd1 is NE0_Vrd1.

Referring to mathematical formula 5 below, a difference between the number (NE0) of original memory cells and the number (NE0_Vrd1) of memory cells of erase state read based on the Vrd1 is the same as a difference between the number (FB0_Vrd1) of 0 fail bits and the number (FB1_Vrd1) of 1 fail bits that are read based on the Vrd1.

NE0_Vrd1=NE0+FB0Vrd1−FB1_Vrd1

FB1_Vrd1−FB0_Vrd1=NE0−NE0_Vrd1

$$\Delta Vrd1 = f(NE0-NE0\_Vrd1) \quad \text{[mathematical formula 5]}$$

If combining the mathematical formula 5 with a difference between the total number of 0 and 1 fail bits, a difference between 0 fail bits and 1 fail bits in the Vrd3 can be calculated. Mathematical formula 6 shows a method of calculating Vrd3.

FB1−FB0=FB1_Vrd3+(FB1_Vrd1−FB0_Vrd1)−FB0_Vrd3

FB1_Vrd3−FB0_Vrd3=FB1−FB0−(NE0−NE0_Vrd1)

$$\Delta Vrd3 = f[(FB1-FB0)-(NE0-NE0\_Vrd1)] \quad \text{[mathematical formula 6]}$$

The data storage device 1000 may calculate a moving direction and a moving level of the read voltage (Vrd1, Vrd3) using the mathematical formula 5 and the mathematical formula 6. A moving direction and a moving level of the read voltage Vrd2 of the P1 state and the P2 state may be calculated using the method of FIG. 10 described above.

FIG. 14 is a table for explaining a method of predicting a moving direction of a read voltage. The data storage device 1000 according to example embodiments of inventive concepts can easily predict a moving direction without calculating a moving level of the read voltage. Referring to FIG. 14, since a difference between the number of 0 fail bits and the number of 1 fail bits that occurred in Vrd1 and Vrd3 respectively is known, a direction of an optimum read voltage in a current read voltage is known using + information and − information.

For example, in a desired (and/or alternatively predetermined) table (PDT), a first case shows an example where both ΔVrd1 and ΔVrd3 move in a (+) direction. A second case shows where ΔVrd1 moves in a (+) direction and ΔVrd3 moves in a direction (−) direction. A third case shows where ΔVrd1 moves in a (−) direction and ΔVrd3 moves in a direction (+) direction. A fourth case shows an example where both ΔVrd1 and ΔVrd3 move in a (−) direction. Here, (+) direction means that an optimum read voltage moves in the right direction and (−) direction means that an optimum read voltage moves in the left direction in FIG. 13. As illustrated in FIG. 14, inventive concepts may be used to reduce number of cases by selecting an optimum moving direction set in a desired (and/or alternatively predetermined) read level table set.

The data storage device according to example embodiments of inventive concepts may be applied to various types of products. The data storage device may be implemented with not only electronic devices such as a personal computer, a digital camera, a camcorder, a cellular phone, a MP3, a PSP, a PDA, etc. but also a storage device such as a memory card, a USB memory, a solid state drive, etc.

Figure 15:
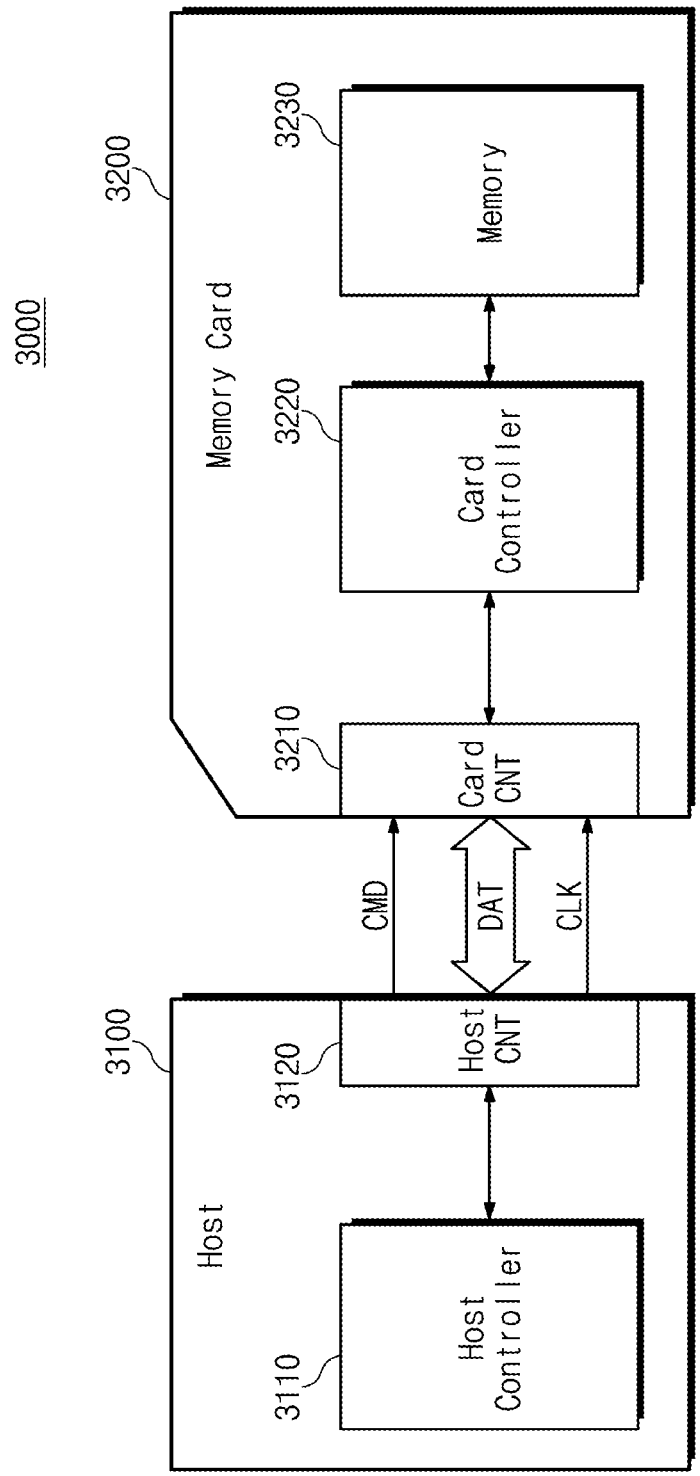
FIG. 15 is a block diagram illustrating a memory card system according to example embodiments of inventive concepts.

FIG. 15 is a block diagram illustrating a memory card system according to example embodiments of inventive concepts. As illustrated, the memory card system 3000 may include a host 3100 and a memory card 3200. The host 3100 may include a host controller 3110, a host connection unit 3120, and a DRAM (not shown).

The host 3100 may write data in the memory card 3200 and read data from the memory card 3200. The host controller 3110 may send a command (e.g., a write command), a clock signal CLK generated from a clock generator (not shown) in the host 3100, and data to the memory card 3200 via the host connection unit 3120. The DRAM (not shown) may be a main memory of the host 3100.

The memory card 3200 may include a card connection unit 3210, a card controller 3220, and a flash memory 3230. The card controller 3220 may store data in the flash memory 3230 in response to a command input via the card connection unit 3210. The data may be stored in synchronization with a clock signal generated in the card controller 3220. The flash memory 3230 may store data transferred from the host 3100. For example, in a case where the host 3100 is a digital camera, the flash memory 3230 may store image data.

The memory card system 3000 may be, for example, an MMC card, an SD card, a multiuse card, a micro SD card, a memory stick, a compact SD card, an ID card, a PCMCIA card, an SSD card, a chipcard, a smartcard, a USB card or the like. The card controller 3220 and the flash memory 3230 may include the data storage device 1000 described in FIG. 1 of the present application. Thus, a time taken to determine the optimum read voltage level is reduced and a read performance of a data storage device according to example embodiments in the memory card system 3000 is improved.

Figure 16:
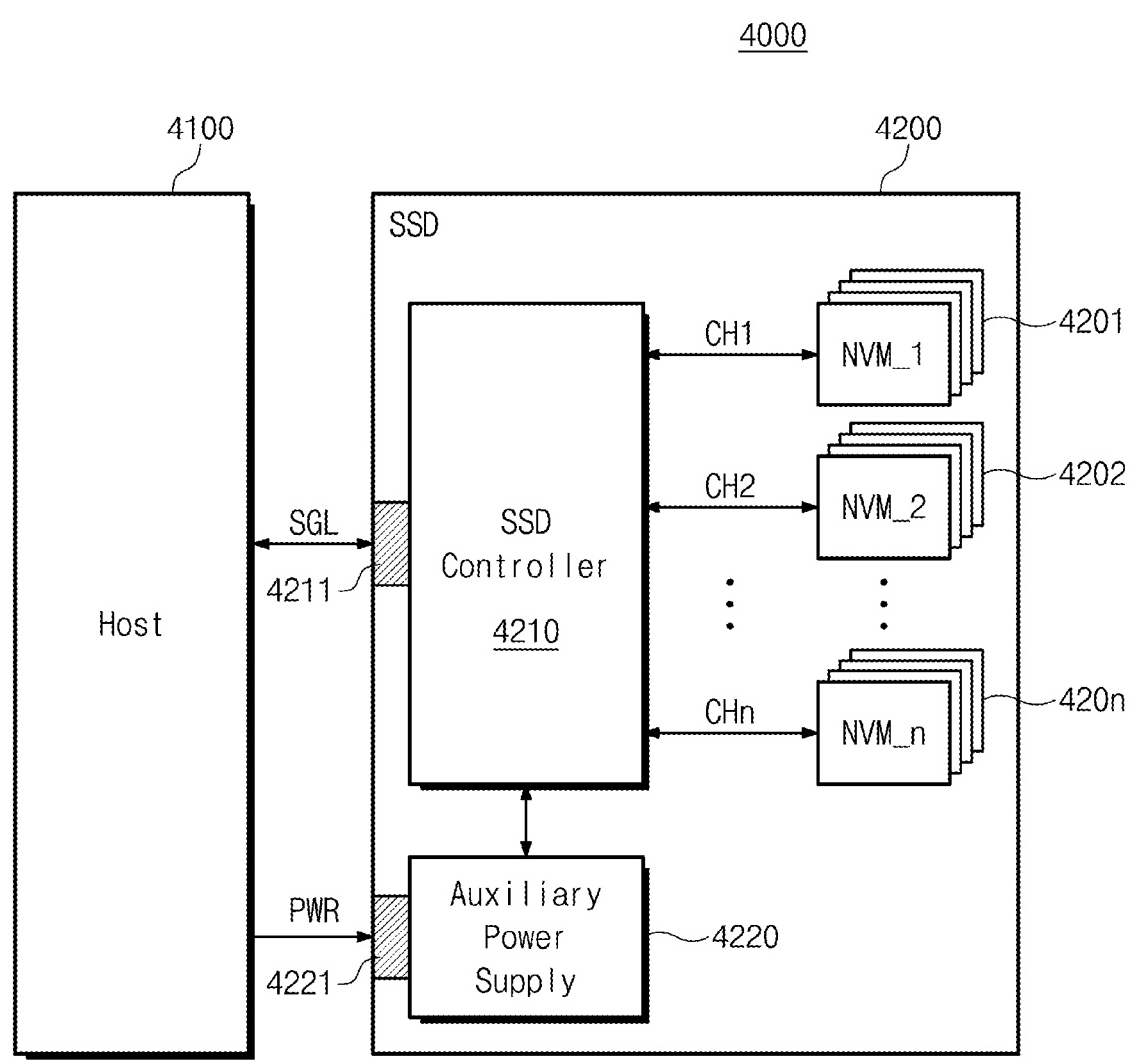
FIG. 16 is a block diagram illustrating a solid-state drive (SSD) system according to example embodiments of inventive concepts.

FIG. 16 is a block diagram illustrating a solid-state drive (SSD) system according to example embodiments of inventive concepts. As illustrated, the SSD system 4000 includes a host 4100 and an SSD 4200. The host 4100 may include a host interface 4111, a host controller 4120, and a DRAM 4130.

The host 4100 may write data in the SSD 4200 or read data from the SSD 4200. The host controller 4120 may transfer signals SGL such as a command, an address, a control signal, and the like to the SSD 4200 via the host interface 4111. The DRAM 4130 may be a main memory of the host 4100.

The SSD 4200 may exchange signals SGL with the host 4100 via the host interface 4211 and may be supplied with power via a power connector 4221. The SSD 4200 may include a plurality of nonvolatile memories 4201 to 420n, an SSD controller 4210, and an auxiliary power supply 4220. The nonvolatile memories 4201 to 420n may be implemented using not only a flash memory but also PRAM, MRAM, ReRAM or the like.

The plurality of nonvolatile memories 4201 to 420n may be used as a storage medium of the SSD 4200. The plurality of nonvolatile memories 4201 to 420n may be connected with the SSD controller 4210 via a plurality of channels CH1 to CHn. A single channel may be connected to one or more nonvolatile memories. The nonvolatile memories connected to the single channel may be connected to the same data bus.

The nonvolatile memory may be packaged into a single package. For example, the DRAM 3500 may be packaged using one of various types of packages such as PoP (Package on Package), Ball grid arrays (BGAs), Chip scale packages (CSPs), Plastic Leaded Chip Carrier (PLCC), Plastic Dual In-Line Package (PIMP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

The SSD controller 4210 may exchange signals SGL with the host 4100 via the host interface 4211. The signals SGL may include a command, an address, data, and the like. The SSD controller 4210 may be configured to write or read data into or from a corresponding nonvolatile memory according to a command of the host 4100. The SSD controller 4210 may have the same configuration as shown in FIG. 16.

The auxiliary power supply 4220 may be connected to the host 4100 via the power connector 4221. The auxiliary power supply 4220 may be charged by power PWR from the host 4100. The auxiliary power supply 4220 may be disposed inside or outside the SSD 4200. For example, the auxiliary power supply 4220 may be disposed on a mainboard to supply auxiliary power to the SSD 4200.

The SSD controller 4210 and nonvolatile memories 4201 to 420n may be implemented using data storage device 1000 in FIG. 1 of the present application. Since the SSD controller 4210 includes a Vrd search unit 1260 according to example embodiments of inventive concepts, a time taken to determine the optimum read voltage level is reduced and a read performance of a data storage device according to example embodiments in the SSD system 4000 is improved.

Figure 17:
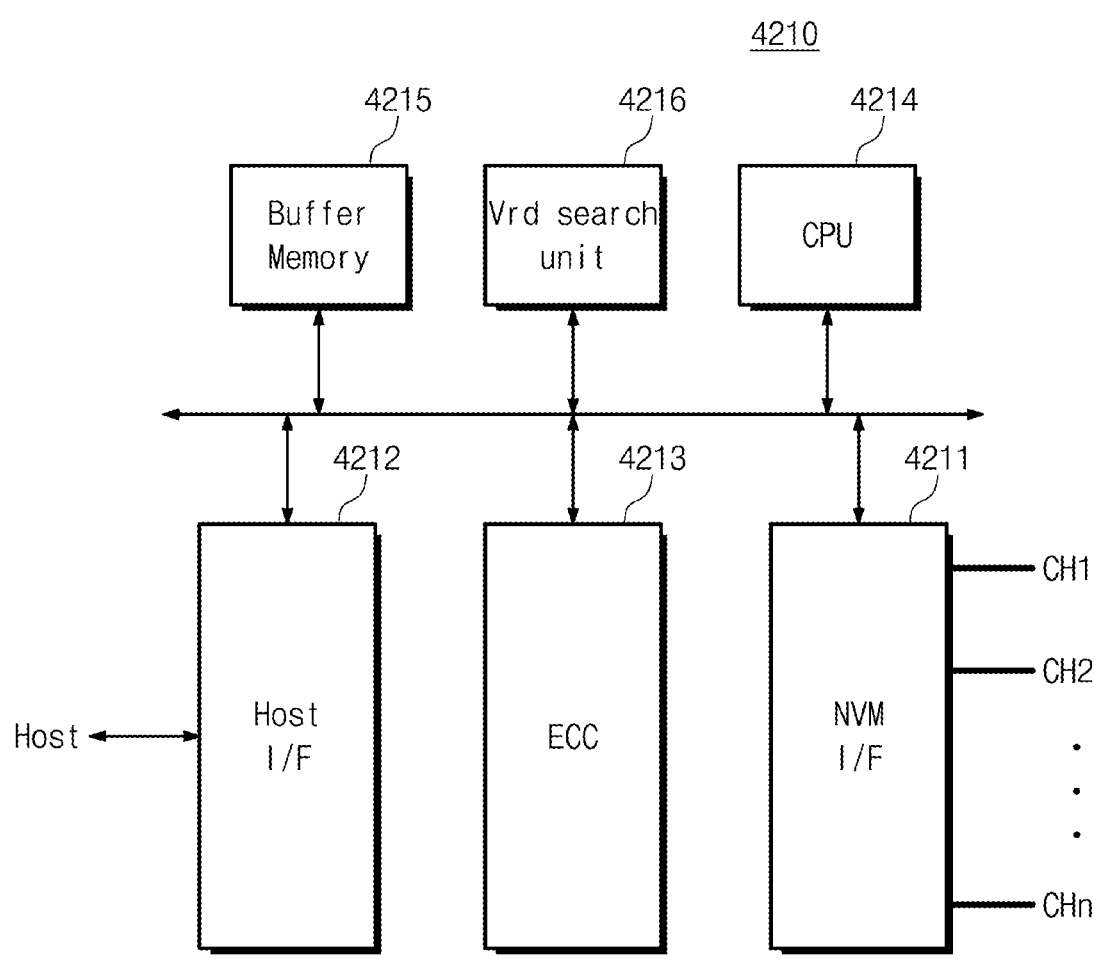
FIG. 17 is a block diagram of an SSD controller in FIG. 16.

FIG. 17 is a block diagram of an SSD controller in FIG. 16. As illustrated, the SSD controller 4210 includes an NVM interface 4211, a host interface 4212, a fast open manger 4213, a control unit 4214, and an SRAM 4215.

The NVM interface 4211 may scatter data transferred from a main memory of a host 4100 to channels CH1 to CHn, respectively. The NVM interface 4211 may transfer data read from nonvolatile memories 4201 to 420n to the host 4100 via the host interface 4212.

The host interface 4212 may provide an interface with an SSD 4200 according to the protocol of the host 4100. The host interface 4212 may communicate with the host 4100 using USB (Universal Serial Bus), SCSI (Small Computer System Interface), PCI express, ATA, PATA (Parallel ATA), SATA (Serial ATA), SAS (Serial Attached SCSI) or the like. The host interface 4212 may perform a disk emulation function which enables the host 4100 to recognize the SSD 4200 as a hard disk drive (HDD).

The fast open manager 4213 fast loads mapping blocks stored in the nonvolatile memories 4201 to 420n to a buffer memory during rebooting to fast reconstruct an address mapping table, as described above.

The control unit 4214 may analyze and process a signal SGL input from the host 4100. The control unit 4214 may control the host 4100 via the host interface 4212 or the nonvolatile memories 4201 to 420n via the NVM interface 4211. The control unit 4214 may control the nonvolatile memories 4201 to 420n using firmware for driving the SSD 4200. The functions of the fast open manager 4213 may be integrated into the control unit 4214.

The SRAM 4215 may function as a buffer memory and may be used to drive software that efficiently manages the nonvolatile memories 4201 to 420n. The SRAM 4215 may store metadata input from a main memory of the host 4100 or cache data. During a sudden power-off operation, metadata or cache data stored in the SRAM 4215 may be stored in the nonvolatile memories 4201 to 420n using an auxiliary power supply 4220.

Figure 18:
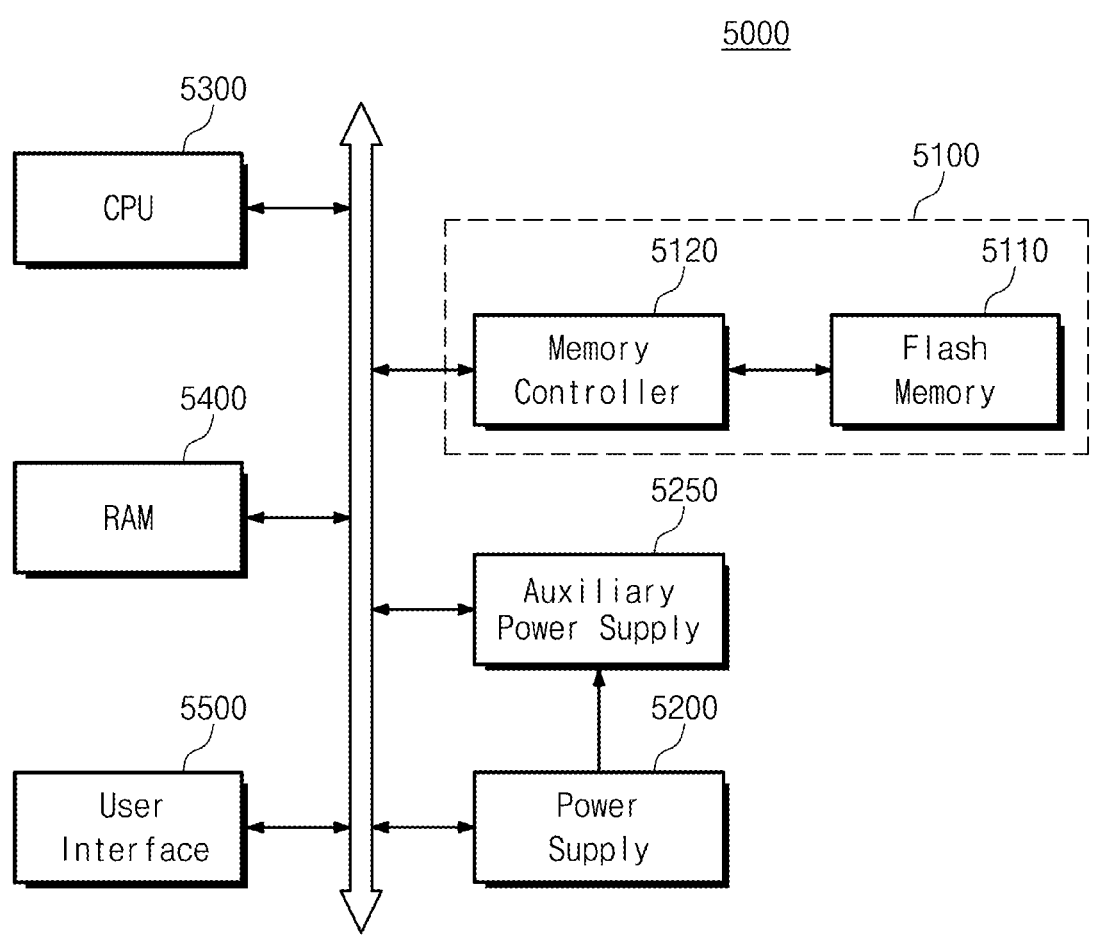
FIG. 18 is a block diagram of a memory system according to example embodiments of inventive concepts implemented in an electronic device.

FIG. 18 is a block diagram of a memory system according to example embodiments of inventive concepts implemented in an electronic device. The electronic device 5000 may be provided as one of a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a digital multimedia broadcasting (DMB) player, a three-dimensional television, a smart television, a digital audio recorder, a digital audio player, a digital picture recorder, a digital picture player, a digital video recorder, and a digital video player, a device capable of transmitting/receiving information in wireless environment, one of various electronic devices constituting a home network, an RFID device or one of various elements constituting a computing system.

As illustrated in FIG. 18, the electronic device 5000 may include a memory system 5100, a power supply 5200, an auxiliary power supply 5250, a central processing unit (CPU) 5300, a DRAM 5400, and a user interface 5500. The memory system 5100 may include a flash memory 5110 and a memory controller 5120. The memory system 5100 may be embedded within the electronic device 5000.

The memory controller 5120 may include the read voltage search unit 1260 described in FIG. 1 of the present application. Thus, a time taken to determine the optimum read voltage level is reduced and a read performance of a data storage device according to example embodiments in the electronic device 5000 is improved.

Having described some example embodiments of inventive concepts, it is further noted that it is readily apparent to those of reasonable skill in the art that various modifications may be made without departing from the spirit and scope of inventive concepts which is defined by the metes and bounds of the appended claims.

What is claimed is:

1. A data storage device comprising:
a nonvolatile memory including one read unit that is configured to store a plurality of codewords on one word line; and
a memory controller configured to determine a read voltage if an uncorrectable error occurs in one or more of the plurality of codewords on the one word line that are stored in the nonvolatile memory, and
wherein the memory controller is configured to:
calculate a total number of first fail bits corresponding to the one word line based on a number of the first fail bits of correctable codewords among the plurality of codewords,
calculate a total number of second fail bits corresponding to the one word line based on a number of the second fail bits of the correctable codewords among the plurality of codewords,
determine the read voltage based on the calculated total number of the first fail bits and the calculated total number of the second fail bits, and
control a read operation performed on the one read unit using the determined read voltage, and
wherein the first fail bits of the correctable codewords are corrected from first value to second value and the second fail bits of the correctable codewords are corrected from the second value to the first value.

2. The data storage device of claim 1, wherein
the memory controller is configured to calculate the total number of the first fail bits and the total number of the second fail bits using all of the correctable codewords on the one word line.

3. The data storage device of claim 1, wherein the memory controller is configured to search a moving direction of the read voltage of the nonvolatile memory, based on the calculated total number of the first fail bits and the calculated total number of the second fail bits.

4. The data storage device of claim 3, wherein the memory controller is configured to calculate a moving direction of the read voltage and a moving level of the read voltage of the nonvolatile memory, based on the calculated total number of the first fail bits and the calculated total number of the second fail bits.

5. The data storage device of claim 1, wherein the nonvolatile memory is a flash memory.

6. The data storage device of claim 5, wherein the flash memory includes memory cells stacked in a direction perpendicular to a substrate.

7. The data storage device of claim 1, wherein the nonvolatile memory is a resistive memory.

8. A data storage device comprising:
a nonvolatile memory including one read unit that is configured to store a plurality of codewords on one word line; and
a memory controller configured to adjust a first read voltage to distinguish between a first state and a second state and a second read voltage to distinguish between a third state and a fourth state if a fail occurs in one or more of the plurality of codewords stored on the one word line that are stored in the nonvolatile memory, and
wherein the memory controller is configured to:
adjust the first read voltage based on a difference between a first number of memory cells of the first state in a program operation of the one word line and a second number of memory cells of the first state read based on the first read voltage provided to the one word line,
calculate a first total number of first fail bits corresponding to the one word line based on a number of the first fail bits of correctable codewords among the plurality of codewords,
calculate a second total number of second fail bits corresponding to the one word line based on a number of the second fail bits of the correctable codewords among the plurality of codewords,
adjust the second read voltage based on the first total number, the second total number, and the difference between the first number and the second number, and
control a read operation performed on the one read unit using the adjusted first read voltage and the adjusted second read voltage, and
wherein the first fail bits of the correctable codewords are corrected from first value to second value and the second fail bits of the correctable codewords are corrected from the second value to the first value.

9. The data storage device of claim 8, wherein the memory controller is configured to determine a moving direction of the first read voltage and a moving direction of the second read voltage by selecting a desired set of the nonvolatile memory.

10. The data storage device of claim 8, wherein
the memory controller includes an ECC circuit and a read voltage search unit,
the ECC circuit is configured to perform an error correction operation in units of codewords, and
the read voltage search unit is configured to receive ECC information from the ECC circuit to perform a read voltage search operation.

11. The data storage device of claim 10, wherein
the memory controller is configured to calculate the first total number and the second total number using all of the correctable codewords on the one word line.

12. The data storage device of claim 11, wherein the read voltage search unit is configured to predict a moving direction of the first read voltage and the second read voltage based on relationship between the first total number and the second total number.

13. The data storage device of claim 8, wherein the nonvolatile memory includes memory cells stacked in a direction perpendicular to a substrate.

14. The data storage device of claim 8, wherein the nonvolatile memory is a resistive memory.

15. The data storage device of claim 8, wherein
the nonvolatile memory includes a plurality of memory cells connected to a plurality of word lines and a plurality of bit lines,
the plurality of memory cells are organized in read units,
the plurality of word lines include the one word line,
the read units include the one read unit,
each of the read units is configured to store a corresponding plurality of codewords on a corresponding word line.

16. The data storage device of claim 15, wherein
the plurality of memory cells are organized as a plurality of strings, and
each of the strings includes several of the memory cells stacked on top of each other between a ground selection transistor and a string selection transistor.

17. The data storage device of claim 8, wherein the memory controller is configured to predict moving directions of the first and second read voltages and moving levels of the first and second read voltages based on the first total number, the second total number, and the difference between the first number and the second number.

* * * * *